United States Patent [19]

Lee

[11] Patent Number: 5,605,859
[45] Date of Patent: Feb. 25, 1997

[54] METHOD OF MAKING INSULATOR STRUCTURE FOR POLYSILICON RESISTORS

[75] Inventor: Chung-Kuang Lee, Hsin-Chu, Taiwan

[73] Assignee: Taiwan Semiconductor Manufacturing Company, Ltd., Hsin-Chu, Taiwan

[21] Appl. No.: 498,355

[22] Filed: Jul. 5, 1995

[51] Int. Cl.$^6$ .............................................. H01L 21/8244
[52] U.S. Cl. .......................... 437/60; 437/231; 437/918
[58] Field of Search .............................. 437/60, 918, 231

[56] References Cited

U.S. PATENT DOCUMENTS 4,413,271  11/1983  Gontowski et al. .
4,951,118  8/1990  Nakamura .
5,525,831  6/1996  Ohkawa et al. ...................... 257/543

Primary Examiner—John Niebling
Assistant Examiner—Richard A. Booth
Attorney, Agent, or Firm—George O. Saile; Alek P. Szecsy

[57] ABSTRACT

A polysilicon resistor structure for use within integrated circuits and a method by which the polysilicon resistor structure may be formed. A first insulating layer which is formed from a glasseous material is formed directly upon the surface of a semiconductor substrate. A polysilicon resistor is formed in contact with the first insulating layer. A second insulating layer is formed directly upon the first insulating layer and over the polysilicon resistor. The second insulating layer is formed from a silicon oxide material deposited through a Plasma Enhanced Chemical Vapor Deposition process employing silane as the silicon source material.

13 Claims, 2 Drawing Sheets

METHOD OF MAKING INSULATOR STRUCTURE FOR POLYSILICON RESISTORS

BACKGROUND OF THE INVENTION

1. Field of the Invention

The present invention relates generally to insulator layers and polysilicon resistors formed within integrated circuits. More particularly, the present invention relates to a structure of insulator layers formed within an integrated circuit, which structure of insulator layers maintains the integrity of a polysilicon resistor formed within that structure of insulator layers.

2. Description of Related Art

In addition to the use of transistors and diodes as switching elements and current rectifying devices in semiconductor integrated circuits, it is also quite common in the art that those circuits will have resistors incorporated into their designs and fabrications. Commonly, a resistor structure within an integrated circuit will provide an electrical load which assures proper operation of the circuit under the electrical current and voltage parameters to which the circuit was designed.

Of the several methods and materials from which resistors may be formed within integrated circuits, the fabrication of resistors from layers of polysilicon formed upon semiconductor substrates has become quite common in the art. Resistors formed from such polysilicon layers possess several advantages within integrated circuit fabrications. First, such resistors are readily and conveniently manufacturable since the polysilicon layers from which polysilicon resistors may be fabricated have several additional applications within integrated circuits. In addition, resistors formed from polysilicon layers may be fabricated through a wide range of resistances by means of incorporating various types and quantities of dopant species into those layers.

Although the fabrication and use of resistors formed from polysilicon layers provides an attractive and convenient method for fabricating resistors within integrated circuits, the fabrication and use of such resistors is not without several problems. One of the more significant problems with the fabrication and use of polysilicon resistors within integrated circuits is the stability of the resistance of the polysilicon layer from which is formed the polysilicon resistor. As is known in the art, the methods by which polysilicon layers are formed upon semiconductor substrates yield polysilicon layers which possess significant residual reactivity. This residual reactivity of the polysilicon layers remains even after the layers have been formed upon a semiconductor substrate, patterned into polysilicon resistors and exposed to several additional integrated circuit processing operations.

The reactivity of these layers is believed to result from incomplete reaction of the precursor materials from which polysilicon layers are formed. Specifically, the incomplete reaction of the precursor materials is believed to yield residual reactive sites within the polysilicon resistor formed from the polysilicon layer. Upon subsequent semiconductor processing operations, various mobile species may infiltrate into the polysilicon resistor and react with the residual reactive sites within the polysilicon resistor causing significant chemical and/or physical changes in the polysilicon resistor material. These chemical and/or physical changes may be manifested by significant changes in the resistivity of the polysilicon resistor. Such changes are often difficult to predict and may lead to significant reliability or functionality problems in semiconductor integrated circuits in which those polysilicon resistors are formed.

It is thus desirable, in order to assure optimal and reproducible performance of polysilicon resistors and the integrated circuits into which those polysilicon resistors are formed, to provide integrated circuit structures surrounding those polysilicon resistors which optimally assure the stability of the resistance of those polysilicon resistors. The stability of the resistance is preferably assured independent of the quantity or nature of integrated circuit processing operations to which those polysilicon resistors may subsequently be exposed.

The present invention is directed towards the goal of assuring the stability of the resistance of polysilicon resistors within integrated circuits independent of subsequent processing operations to which those polysilicon resistors may be exposed. The method by which the present invention achieves that goal is through the choice of insulator layers which surround a polysilicon resistor within an integrated circuit.

SUMMARY OF THE INVENTION

A first object of the present invention is to provide a polysilicon resistor structure within a semiconductor integrated circuit, which polysilicon resistor within the polysilicon resistor structure possesses limited susceptibility to resistance changes due to subsequent processing operations in forming an integrated circuit into which the polysilicon resistor structure is formed.

A second object of the present invention is to provide a polysilicon resistor structure in accord with the first object of the present invention, which polysilicon resistor structure is readily manufacturable.

A third object of the present invention is to provide a polysilicon resistor structure in accord with the first and second objects of the present invention, the method of manufacture of which polysilicon resistor structure may readily be incorporated into existing integrated circuit manufacturing processes.

In accord with the objects of the present invention, a new polysilicon resistor structure for use within integrated circuits is described along with its method of manufacture. The polysilicon resistor structure is formed through forming a first insulating layer directly upon a semiconductor substrate. The first insulating layer is formed from a glasseous material. A polysilicon resistor is formed in contact with the first insulating layer. A second insulating layer is then formed directly upon the first insulating layer and above the polysilicon resistor. The second insulating layer is formed from a silicon oxide material deposited through a Plasma Enhanced Chemical Vapor Deposition (PECVD) process employing silane as the silicon source material.

The polysilicon resistor formed within the polysilicon resistor structure of the present invention possesses limited susceptibility to resistance changes due to subsequent processing operations in forming an integrated circuit into which the polysilicon resistor structure of the present invention is formed. The polysilicon resistor of the present invention is formed in contact with a first insulating layer, which first insulating layer is formed from a glasseous material. The glasseous materials from which may be formed the first insulating layer have been found to possess limited susceptibility to outgassing of mobile species which might diffuse into the polysilicon resistor and cause the resistance of the polysilicon resistor to deteriorate.

In addition, the polysilicon resistor of the present invention and the first insulating layer with which the polysilicon resistor of the present invention makes contact are formed between materials which have limited permeability to mobile species which might diffuse into the polysilicon resistor through subsequent integrated circuit processing operations. These materials include: (1) the semiconductor substrate upon which the polysilicon resistor of the present invention is formed, and (2) the second insulating layer formed from a silicon oxide material deposited through a Plasma Enhanced Chemical Vapor Deposition (PECVD) process employing silane as the silicon source material, beneath which second insulating layer the polysilicon resistor of the present invention resides. Together, these two materials provide a barrier to intrusion of mobile species through the first insulating layer of the present invention and into the polysilicon resistor of the present invention, which mobile species might otherwise react with the polysilicon from which the polysilicon resistor is formed resulting in resistance changes in that polysilicon resistor.

The polysilicon resistor structure of the present invention is readily manufacturable. The polysilicon resistor structure employs methods and materials which are known in the art of integrated circuit manufacturing. The polysilicon resistor structure of the present invention requires neither any additional integrated circuit process equipment nor any new materials for its complete fabrication.

The polysilicon resistor structure of the present invention may be readily manufactured through incorporation of a discrete set of integrated circuit manufacturing processes or a discrete set of integrated circuit manufacturing process and materials changes into an established integrated circuit manufacturing process. The method by which is formed the polysilicon resistor structure of the present invention is direct and straight forward. The polysilicon resistor structure of the present invention may be fabricated into existing integrated circuit device structures with minimal disruption of manufacturing facilities within which those integrated circuit devices are manufactured.

BRIEF DESCRIPTION OF THE DRAWINGS

The accompanying drawings, which form a material part of this disclosure, show the following.

DETAILED DESCRIPTION OF THE PREFERRED EMBODIMENT

The present invention provides a polysilicon resistor structure within an integrated circuit, which polysilicon resistor structure is comprised of a minimum of one polysilicon resistor layer and a minimum of two insulating layers. The first insulating layer is formed directly upon the surface of a semiconductor substrate. The first insulating layer is formed from a glasseous material. The polysilicon resistor of the present invention makes contact with the first insulating layer. The second insulating layer is formed from a silicon oxide material deposited through a Plasma Enhanced Chemical Vapor Deposition (PECVD) process employing silane as the silicon source material. The second insulating layer is formed directly upon the surface of the first insulating layer and above the polysilicon resistor of the present invention.

While the chemical and/or physical mechanisms by which the insulating layers of the resistor structure of the present invention provide a barrier to deterioration of the polysilicon resistor of the present invention are not well understood, it is nonetheless clear that the insulating layers of the polysilicon resistor structure of the present invention provide a resistor structure wherein the polysilicon resistor within the polysilicon resistor structure of the present invention has limited susceptibility to change in resistance during subsequent integrated circuit processing operations.

The polysilicon resistor structure of the present invention may be used in any integrated circuit where there is needed a polysilicon resistor having a resistance which is stable. Polysilicon resistor structures formed through the method of the present invention may be used in integrated circuits including but not limited to Dynamic Random Access Memory (DRAM) integrated circuits, Static Random Access Memory (SRAM) integrated circuits, bipolar transistor integrated circuits and field effect transistor integrated circuits. Polysilicon resistor structures of the present invention have broad applicability in integrated circuit fabrications.

Figure 1A:
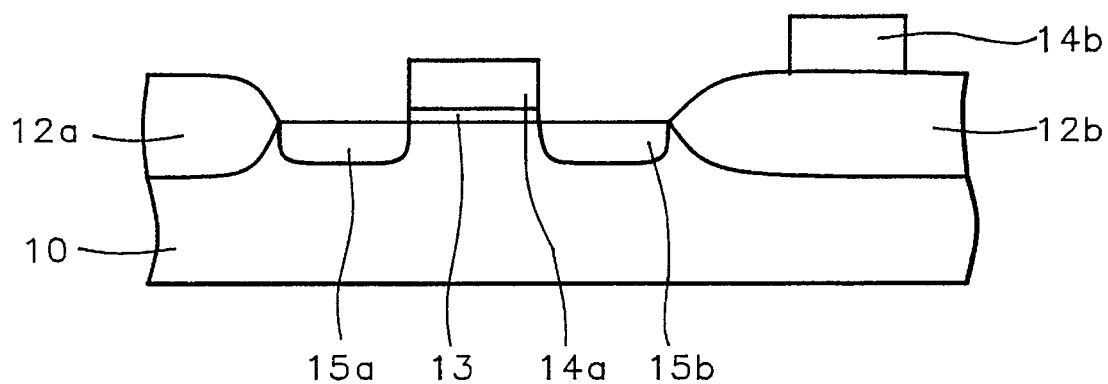
FIG. 1a to FIG. 1c shows a series of schematic cross-sectional diagrams illustrating an integrated circuit having formed therein a polysilicon resistor structure in accord with the preferred embodiment of the present invention.
Figure 1B:
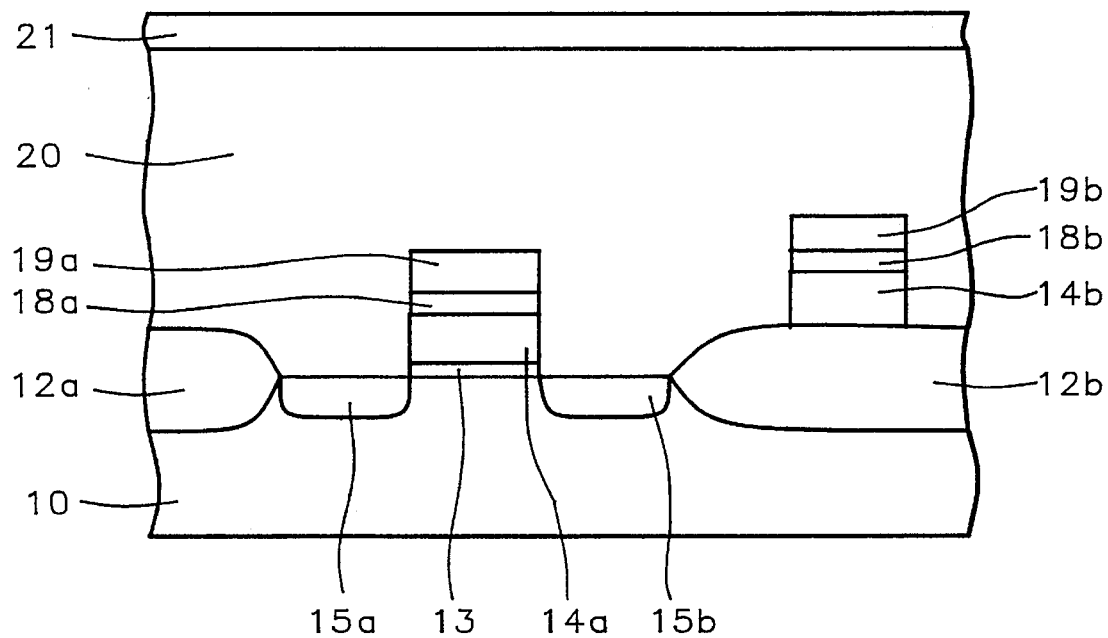
Figure 1C:
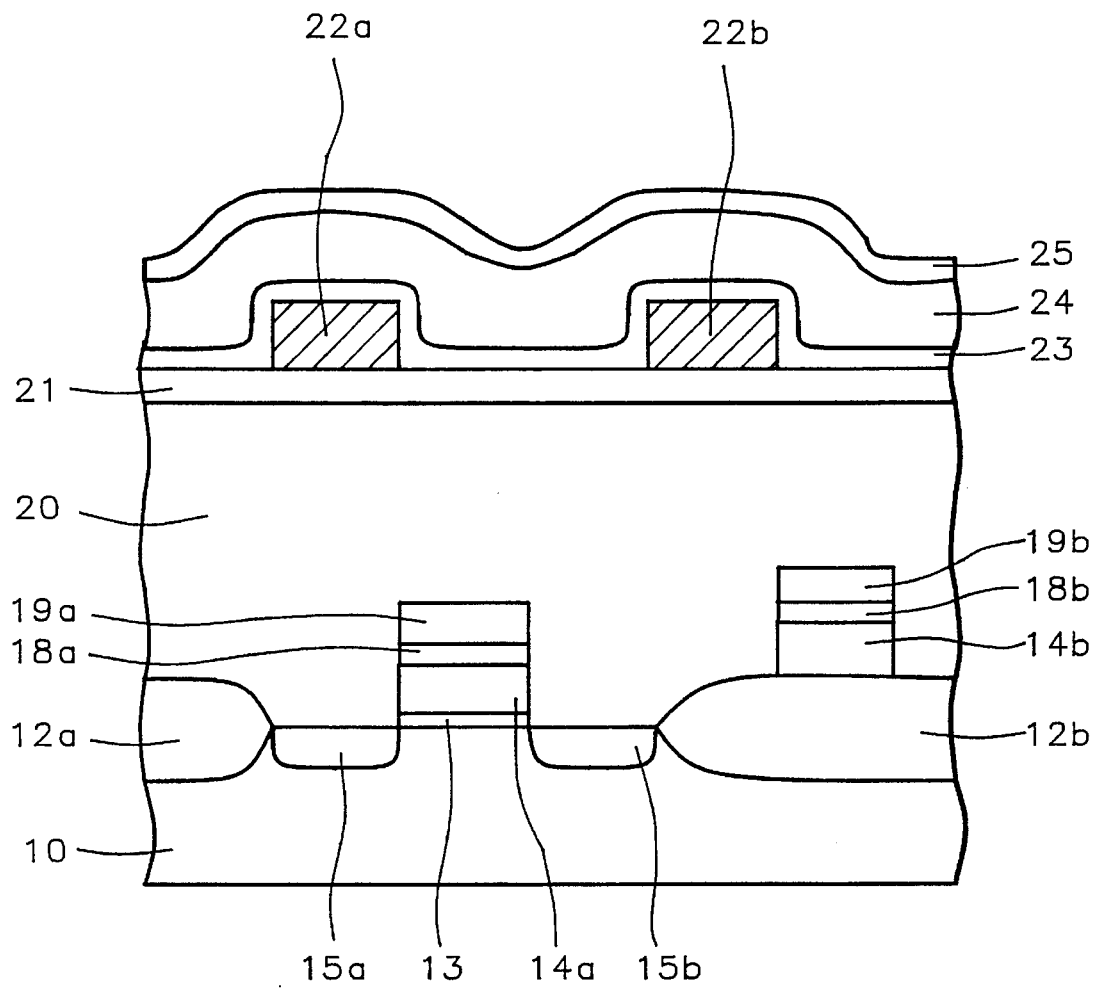

Referring now to FIG. 1a to FIG. 1c there is shown a series of cross-sectional schematic diagrams which illustrate an integrated circuit at progressive stages of fabrication in accord with the preferred embodiment of the present invention.

Shown in FIG. 1a is a cross-sectional schematic diagram which illustrates an integrated circuit at the first stages of processing in accord with the preferred embodiment of the present invention. Shown in FIG. 1a is a semiconductor substrate 10 which has formed within and upon its surface a pair of field oxide isolation regions 12a and 12b which define an active semiconductor region of the semiconductor substrate 10. The semiconductor substrate 10 upon which the present invention may be practiced may be either an N doped semiconductor substrate or a P doped semiconductor substrate. The present invention may be practiced upon semiconductor substrates of various doping types, various doping levels and various crystallographic orientations.

Methods and materials through which field oxide isolation regions may be formed within and upon semiconductor substrates are well known in the art. Such methods include but are not limited to thermal oxidation methods which consume a portion of the surface of a semiconductor substrate, as well as methods which involve deposition and patterning of a layer of insulating material upon the surface of a semiconductor substrate. For the preferred embodiment of the present invention, it is preferred that the pair of field oxide isolation regions 12a and 12b be formed through a thermal oxidation process by which portions of the semiconductor substrate 10 exposed through an appropriate mask are oxidized.

Also shown in FIG. 1a are the structures of a field effect transistor. Specifically, there is shown a gate electrode 14a upon a gate oxide layer 13. Adjoining the gate electrode 14a are source/drain electrodes 15a and 15b which are formed within the semiconductor substrate 10. All of the structures of the field effect transistor formed within the preferred embodiment of the present invention may be formed through methods which are conventional to the art. Typically, gate oxide layers are formed through processes including but not limited to processes whereby the semiconductor substrate within an active semiconductor region is thermally oxidized to form a gate oxide layer and processes whereby a thin oxide layer is formed over a semiconductor substrate and patterned to form a gate oxide layer. For the preferred embodiment of the present invention, the gate oxide layer 13 is preferably formed through a thermal oxidation process to yield a gate oxide layer 13 of thickness of about 80 to about 120 angstroms.

Gate electrodes within field effect transistors are typically formed through deposition and patterning of blanket layers of highly conductive materials such as metals, metal alloys, polycides and highly doped polysilicon. Such blanket layers may be deposited upon semiconductor substrate surfaces through methods including but not limited to thermal evaporation methods, electron beam assisted evaporation methods, Chemical Vapor Deposition (CVD) methods, and sputtering methods. Such materials may be formed into desired patterns through photomasking and etching techniques as are known in the art. For the preferred embodiment of the present invention, the gate electrode 14a is preferably formed through deposition and patterning of a blanket layer of highly doped polysilicon formed upon the semiconductor substrate 10 surface through a Chemical Vapor Deposition (CVD) process. The gate electrode 14 is preferably about 2000 to about 4000 angstroms thick.

Source/drain electrodes are typically formed within active semiconductor regions subsequent to forming gate oxides and gate electrodes. Source/drain electrodes are typically formed within active semiconductor regions through the process of implanting dopant ions into those regions. Dopant ions which may typically be implanted when forming source/drain electrodes in field effect transistors include but are not limited to arsenic ions, boron ions, boron difluoride ions and phosphorus ions. For the preferred embodiment of the present invention, the preferred dopant ion for forming the source/drain electrodes 15a and 15b is arsenic ion when the source/drain electrodes 15a and 15b are of negative polarity and boron difluoride ion when the source/drain electrodes 15a and 15b are of positive polarity. For either arsenic ion or boron difluoride ion, the preferred ion implantation conditions are about 1E15 to about 9E15 ions per square centimeter ion implantation dose and about 40 to about 80 keV ion implantation energy.

Finally, there is shown in FIG. 1a a polysilicon gate material layer 14b. The polysilicon gate material layer 14b is formed simultaneously and through the same method and materials as is formed the gate electrode 14a. Specifically, the polysilicon gate material layer 14b is also formed from highly doped polysilicon deposited through a Chemical Vapor Deposition (CVD) process at a thickness of about 2000 to about 4000 angstroms. Polysilicon gate material layers within integrated circuits may be used to provide electrical connections between circuit elements.

Referring now to FIG. 1b there is shown a schematic cross-sectional diagram which illustrates the next series of process steps in accord with the preferred embodiment of the present invention. Illustrated in FIG. 1b is the presence of inter-polysilicon oxide layers 18a and 18b which form insulating layers, respectively, upon the surfaces of the gate electrode 14a and the polysilicon gate material layer 14b. Although the inter-polysilicon oxide layers 18a and 18b may be formed through several methods, including but not limited to methods whereby patterned layers of oxide materials are formed upon the surfaces of the gate electrode 14a and the polysilicon gate material layer 14b, the inter-polysilicon oxide layers 18a and 18b are preferably formed through thermal oxidation of the surfaces of the gate electrode 14a and the polysilicon gate material layer 14b to yield inter-polysilicon oxide layers 18a and 18b of thickness about 500 to about 1000 angstroms.

Formed upon the inter-polysilicon oxide layers 18a and 18b, respectively, are the interconnect polysilicon layer 19a and the polysilicon resistor 19b. The polysilicon resistor 19b is a critical element of the present invention. The interconnect polysilicon layer 19a and the polysilicon resistor 19b are formed simultaneously through patterning of a blanket polysilicon layer formed upon the surface of the semiconductor substrate. Methods and materials through which blanket polysilicon layers may be formed within integrated circuits are well known in the art. Blanket polysilicon layers may be formed through methods including but not limited to sputtering methods, Chemical Vapor Deposition (CVD) methods and Plasma Enhanced Chemical Vapor Deposition (PECVD) methods. The vapor deposition methods may use as silicon source materials gasses including but not limited to silane, disilane and silicon chloride.

For the preferred embodiment of the present invention, the interconnect polysilicon layer 19a and the polysilicon resistor 19b are preferably formed through patterning via photolithographic and etching methods as are common in the art of a blanket polysilicon layer formed through a Chemical Vapor Deposition (CVD) process employing silane as the silicon source material. The thickness of the blanket polysilicon layer is about 500 to about 1000 angstroms. The conductivities of the interconnect polysilicon layer 19a and the polysilicon resistor 19b are preferably varied independently of each other through the process of implanting dopant ions into the interconnect polysilicon layer 19a and the polysilicon resistor 19b. Dopant ions which may be used in varying the conductivity include but are not limited to arsenic ions, boron ions, boron difluoride ions and phosphorus ions.

For the preferred embodiment of the present invention, the conductivity of the interconnect polysilicon layer 19a is preferably varied through an ion implantation process employing arsenic ions at an ion implantation dose of about 2E13 to about 9E13 ions per square centimeter and an ion implantation energy of about 30 to about 50 keV. The conductivity of the polysilicon resistor 19b is preferably varied through an ion implantation process employing phosphorus ions at an ion implantation dose of about 4E13 to about 9E13 ions per square centimeter and an ion implantation energy of about 30 to about 50 keV.

Also shown in FIG. 1b is a first insulating layer 20. The first insulating layer 20 is formed directly upon the semiconductor substrate 10 and makes contact with the polysilicon resistor 19b. The first insulating layer 20 is another critical element of the present invention. It is critical that the first insulating layer 20 not be a source of mobile species which might infiltrate the polysilicon resistor 19b of the present invention causing deterioration of the resistance of that resistor. It is also desirable that the first insulating layer 20 serve as a barrier to such mobile species.

It has been found experimentally that when the first insulating layer 20 is formed of a glasseous material the first insulating layer 20 will possess the desired levels of outgassing and impermeability to provide a stable polysilicon resistor 19b. Typical glasseous materials from which the first insulating layer 20 may be formed include Boro Silicate Glass (BSG), Phospho Silicate Glass (PSG) and Boro Phospho Silicate Glass (BPSG).

Glasseous materials may be formed through several methods as are conventional in the art. Such methods include but are not limited to sputtering of glasseous target source-materials and Chemical Vapor Deposition (CVD) methods employing co-deposition of silicon source materials and glass forming dopant species. For the preferred embodiment of the present invention, the first insulating layer 20 is preferably formed from a Boro Phospho Silicate Glass (BPSG) material formed upon the surface of the semiconductor substrate 10 through a Chemical Vapor Deposition (CVD) process employing Tetra Ethyl Ortho Silicate (TEOS) as the silicon source material, and phosphine and diborane as the glass forming dopant species. The preferred composition of the Boro Phospho Silicate Glass (BPSG) is about 2 to about 3 weight percent boron, about 3 to about 4 weight percent phosphorus. The first insulating layer 20 so formed may easily be reflowed at a temperature of about 800 to about 900 degrees centigrade to form a first insulating layer 20 of thickness of about 6000 to about 9000 angstroms with respect to the active semiconductor region.

Finally, there is shown in FIG. 1b a second insulating layer 21 formed directly upon the first insulating layer 20 and above the polysilicon resistor 19b. The second insulating layer 21 is the last critical element of the present invention. It is critical to the present invention that the second insulating layer 21 be formed from a material which has limited permeability to mobile species which might infiltrate the polysilicon resistor 19b causing deterioration of the resistance of that resistor. Similarly to the first insulating layer 20, it is also critical that the second insulating layer 21 not serve as a source of such mobile species. Thus, while there are many methods and materials from which insulating layers may in general be formed within integrated circuits, there is only a limited number of materials from which the second insulating layer 21 of the present invention may be formed.

It has been found experimentally that the second insulating layer 21 of the preferred embodiment of the present invention is preferably formed from a silicon oxide material deposited through a Plasma Enhanced Chemical Vapor Deposition (PECVD) process employing silane as the silicon source material. The second insulating layer 21 is preferably formed at a deposition temperature of about 300 to about 500 degrees centigrade and a deposition rate of about 5000 to about 10000 angstroms per minute to yield a second insulating layer 21 of refractive index about 1.4 to about 1.5 and thickness of about 1000 to about 4000 angstroms. The second insulating layer 21 formed through this method and material provides the level of impermeability to mobile species needed to protect the polysilicon resistor 19b of the present invention.

Referring now to FIG. 1c there is shown a schematic cross-sectional diagram illustrating the last series of process steps in accord with the preferred embodiment of the present invention. Shown in FIG. 1c is the presence of metal layers 22a and 22b which provide electrical contact to various circuit elements within the integrated circuit within which is formed the resistor structure of the preferred embodiment of the present invention.

Methods and materials by which metal layers may be formed upon semiconductor substrates are known in the art. Metals from which metal layers may be formed include but are not limited to aluminum, aluminum alloys, copper and tungsten. Methods for forming these metal layers upon surfaces of semiconductor substrates include but are not limited to thermal evaporation methods, electron beam assisted evaporation methods, sputtering methods and Chemical Vapor Deposition (CVD) methods. For the preferred embodiment of the present invention, the metal layers 22a and 22b are preferably formed through patterning and etching of a blanket metal layer formed at least in part of an aluminum alloy. The thickness of the blanket metal layer from which is formed the metal layers 22a and 22b is typically about 6000 to about 8000 angstroms.

Also shown in FIG. 1c are a third insulating layer 23, a fourth insulating layer 24 and a fifth insulating layer 25 formed directly over the surfaces of the second insulating layer 21 and the metal layers 22a and 22b. Although the methods and materials through which these three insulating layers may be formed are not critical to the present invention, it is desirable that these three insulating layers be formed of insulating materials which outgas minimal possible amounts of mobile species, which mobile species might diffuse from these three insulating layers and infiltrate into the polysilicon resistor 19b of the present invention causing the resistance of polysilicon resistor 19b to deteriorate.

Typically, the third insulating layer 23, the fourth insulating layer 24 and the fifth insulating layer 25 will be formed from materials which provide characteristics desirable for other features of the integrated circuit within which those insulating layers are formed. Thus, methods and materials through which these three insulating layers may be formed may be quite varied. In general, insulating films within integrated circuits may be formed from several materials including but not limited to oxide materials, nitride materials and glasseous materials. Such materials may be formed through methods including but not limited to sputtering methods, Chemical Vapor Deposition (CVD) methods and Plasma Enhanced Chemical Vapor Deposition (PECVD) methods.

For the preferred embodiment of the present invention, the third insulating layer 23 is preferably formed from a silicon oxide material deposited through a Plasma Enhanced Chemical Vapor Deposition (PECVD) process employing Tetra Ethyl Ortho Silicate (TEOS) as the silicon source material and oxygen as the oxidant. The third insulating layer 23 is preferably about 1000 to about 3000 angstroms thick. The fourth insulating layer 24 is preferably formed from a silicon oxide material formed directly upon the third insulating layer 23 through a Sub Atmospheric Chemical Vapor Deposition (SACVD) process employing Tetra Ethyl Ortho Silicate (TEOS) as the silicon source material and ozone as the oxidant. The fourth insulating layer 24 possesses planarizing properties. The fourth insulating layer 24 is preferably about 3000 to about 6000 angstroms thick. Finally, the fifth insulating layer 25 is also formed from a silicon oxide material deposited through a Plasma Enhanced Chemical Vapor Deposition (PECVD) process employing Tetra Ethyl Ortho Silicate as the silicon source material and oxygen as the oxidant. The fifth insulating layer 25 is formed directly upon the fourth insulating layer 24, preferably at a thickness of about 1000 to about 3000 angstroms.

Upon forming the fifth insulating layer 25, there is formed the integrated circuit of preferred embodiment of the present invention. The integrated circuit has formed therein a resistor structure within which resides a polysilicon resistor 19b which has limited susceptibility to resistance changes due to subsequent processing operations in forming an integrated circuit into which the polysilicon resistor 19b is formed.

EXAMPLES 1–2

A pair of test structures was prepared upon individual semiconductor substrate wafers in order to illustrate the value of the insulator layer structure of the preferred embodiment of the present invention in providing an insulator structure wherein a polysilicon resistor may maintain a high and stable resistance. The test structures were prepared from insulator layers and polysilicon resistors formed in accord with the parameters and limits outlined for the preferred embodiment of the present invention. All thicknesses, doping levels and materials were equivalent for both test structures with the exception that one test structure possessed a second insulating layer formed from a Plasma Enhanced Chemical Vapor Deposition (PECVD) process employing silane as a silicon source material in accord with the preferred embodiment of the present invention. The other test structure possessed no second insulator layer. The results for the measured resistance of the polysilicon resistor formed within each of the two test structures are reported in TABLE I.

TABLE I

| 1st ins | 2nd ins | 3rd ins | 4th ins | 5th ins | Resistance |
|---------|---------|---------|---------|---------|------------|
| BPSG | none | PE-TEOS | O3-TEOS | PE-TEOS | 0.25 Gohm/sq |
| BPSG | PE-SiH4 | PE-TEOS | O3-TEOS | PE-TEOS | 29 |

From the data of TABLE I it is seen that a substantial increase in the stability of a polysilicon resistor formed beneath a multi-layer insulator structure may be obtained if there is formed between the polysilicon resistor and the multi-layer insulator structure an additional insulating layer formed from a silicon oxide material deposited beneath the multi-layer insulator structure through a Plasma Enhanced Chemical Vapor Deposition (PECVD) process employing silane as the silicon source material.

What is claimed is:

1. A method for forming a polysilicon resistor structure within an integrated circuit comprising:

forming a first insulating layer directly upon a semiconductor substrate, the first insulating layer being formed from a glasseous material;

forming a polysilicon resistor in contact with the first insulating layer;

forming a second insulating layer directly upon the first insulating layer and above the polysilicon resistor, the second insulating layer being formed from a silicon oxide material deposited through a Plasma Enhanced Chemical Vapor Deposition process employing silane as the silicon source material, the second inflating layer being formed at a temperature of about 300 to about 500 degrees centigrade and at a deposition rate of about 5000 to about 10000 angstroms per minute to yield the second insulating layer having an index of refraction of about 1.4 to about 1.5.

2. The method of claim 1 wherein the first insulating layer is from about 6000 to about 9000 angstroms thick.

3. The method of claim 1 wherein the glasseous material from which the first insulating layer is formed is chosen from the group of glasseous materials consisting of Boro Silicate Glass (BSG), Phospho Silicate Glass (PSG) and Boro Phospho Silicate Glass (BPSG).

4. The method of claim 1 wherein the glasseous material is Boro Phospho Silicate Glass (BPSG).

5. The method of claim 4 wherein the composition or the Boro Phospho Silicate Glass is about 2 to about 3 weight percent boron and about 3 to about 4 weight percent phosphorus.

6. The method of claim 1 wherein the polysilicon resistor is from about 500 to about 1000 angstroms thick.

7. The method of claim 1 wherein the polysilicon resistor is formed through a Chemical Vapor Deposition (CVD) process employing silane as the silicon source material.

8. The method of claim 1 further comprising incorporating dopant species into the polysilicon resistor.

9. The method of claim 1 wherein the second insulating layer is from about 1000 to about 4000 angstroms thick.

10. The method of claim 1 further comprising a third insulating layer formed upon the surface of the second insulating layer.

11. The method of claim 10 wherein the third insulating layer is formed from a three layer sandwich of insulating layers comprising a bottom insulating layer a middle insulating layer and a top insulating layer.

12. The method of claim 11 wherein the bottom insulating layer and the top insulating layer are formed from silicon oxide materials deposited through a Plasma Enhanced Chemical Vapor Deposition process employing Tetra Ethyl Ortho Silicate as the silicon source material and oxygen as an oxidant, and the middle insulating layer is formed from a silicon oxide material deposited through a Sub Atmospheric Chemical Vapor Deposition process employing Tetra Ethyl Ortho Silicate as the silicon source material and ozone as an oxidant.

13. The method of claim 12 wherein the thickness of the bottom insulating layer is from about 1000 to about 3000 angstroms, the thickness of the middle insulating layer is from about 3000 to about 6000 angstroms and the thickness of tile top insulating layer is from about 1000 to about 3000 angstroms.

* * * * *